United States Patent Office 3,024,180
Patented Mar. 6, 1962

3,024,180

PHOTOPOLYMERIZABLE ELEMENTS

William Jeremiah McGraw, Matawan, N.J., assignor to E. I. du Pont de Nemours and Company, Wilmington, Del., a corporation of Delaware No Drawing. Filed Aug. 17, 1959, Ser. No. 833,928
8 Claims. (Cl. 204—163)

This invention relates to photopolymerizable compositions and elements embodying a solvent-soluble halogen-substituted elastomeric homopolymer, a non-gaseous ethylenically unsaturated compound and an addition polymerization initiator activatably by actinic light.

This application is a continuation-in-part of copending application Ser. No. 664,459 filed June 10, 1957.

Compositions capable of addition polymerization under the influence of actinic light to give rigid, insoluble, tough polymeric shaped articles are of importance, especially in making printing reliefs, as disclosed in Plambeck U.S. Patents 2,760,863 granted Aug. 28, 1956, and 2,791,804 granted May 7, 1957. In the processes described in said patents, printing reliefs having characters of uniform printing height are produced by exposing to actinic light through an image-bearing transparency (negative or positive) a layer comprising an addition-polymerizable, ethylenically unsaturated compound or mixture of compounds having dispersed therethrough an addition-polymerization initiator activatable by said actinic light, and being superposed on and adherent to a suitable support, e.g., a metal plate or foil, until addition polymerization, i.e., insolubilization of the layer composition occurs in the exposed areas of the layer corresponding to the clear areas of the transparency but substantially no such polymerization occurs in the non-exposed areas. Removal of the layer in the non-exposed areas, e.g., by treatment with a suitable solvent in which the polymerized composition in the exposed areas is insoluble, leaves a printing relief of the line or halftone image of the transparency suitable for letterpress work.

An object of this invention is to provide new photopolymerizable compositions and elements which are useful in making reliefs, and particularly printing reliefs, for letterpress printing. Another object is to provide such elements which result in tough, abrasion-resistant printing reliefs of great durability. A further object is to provide such elements wherein the printing relief are resilient and free from brittleness. Still other objects will be apparent from the following description of the invention.

It has been discovered that photopolymerisable compositions comprising at least 40% by weight of at least one solvent-soluble elastomeric homopolymer of a mono- or dihalogen-substituted 1,3-butadiene, at least 10% by weight of at least one compatible addition-polymerizable, ethylenically unsaturated compound having a boiling point at normal pressure over 100° C., a molecular weight of less than 1500 and containing at least one terminal $CH_2=C<$ group and capable of forming a high polymer by photoinitiated addition polymerization in the presence of an addition-polymerization initiator therefor activatable by actinic light, and polymerization-effective amounts of an addition polymerization initiator activatable by actinic light and inactive thermally below 85° C. form useful photopolymerizable layers in photopolymerizable elements which result in tough shaped reliefs which have a resilient surface and are free from brittleness.

In a preferred aspect of the invention the photopolymerizable compositions comprise at least one addition-polymerizable, ethylenically unsaturated compound containing at least two terminal ethylenic double bonds, a compatible, solvent-soluble elastomeric polymer of halogen-substituted butadienes, and polymerization-effective amounts, e.g., 0.01 to 10%, or more, by weight of the ethylenically unsaturated compound of an addition-polymerization initiator activatable by actinic light and inactive thermally below 85°. A particularly preferred addition-polymerization initiator useful in the photopolymerizable compositions is inactive thermally below 185° C. The photopolymerizable composition can also contain a small amount of a thermal addition-polymerization inhibitor.

In general, the elastomeric polymer, i.e., the halogen-substituted 1,3-butadiene polymer, will constitute about 90 to 40%, and the ethylenically unsaturated compound about 10 to 60% by weight of the two aforesaid components.

Suitable monomers for the formation of halogen-substituted 1,3-butadiene polymers include:

2-chloro-1,3-butadiene (chloroprene)
2-fluoro-1,3-butadiene
2,3-dichloro-1,3-butadiene Among the useful addition-polymerizable ethylenically unsaturated compounds containing at least two ethylenic double bonds which form compatible mixtures with the aforesaid described 1,3-butadiene polymers are ethylene glycol dimethacrylate, ethylene glycol diacrylate, and triethylene glycol diacrylate. Other compounds include polyethylene glycol diacrylate (average weight of diol precursor is 200 to 600), triethylene glycol dimethacrylate, and diacrylamides, such as bis(2-methacrylamidoethyl)amine. By compatibility is meant the ability of two or more constituents to remain homogeneously dispersed with one another. Some slight haze of layers coated or extruded from such compositions before or during exposure can be tolerated in the preparation of printing reliefs therefrom but when fine detail is desired, haze preferably is avoided. The above compatible ethylenically unsaturated compounds form high-molecular-weight addition polymers readily by photoinitiated addition polymerization in the presence of an addition polymerization initiator.

The photopolymerizable compositions of this invention are essentially non-light-scattering of the actinic light when in the form of thin layers, e.g., 3 to 250 mils. In order to secure an essentially transparent mixture, i.e., a non-light-scattering mixture, the 1,3-butadiene polymer component should be compatible with, and preferably soluble in, the ethylenic component when used in proportions of 40 to 90% polymer and 10 to 60% (preferably 30 to 60%) ethylenic component. Of course, the initiator absorbs sufficient light energy to initiate the polymerization.

The photopolymerizable elements of this invention can be made by casting or extruding a solution or dispersion of the photopolymerizable composition into the form of a layer on a suitable casting wheel or belt or as a self-supporting sheet, which layer or sheet is then affixed to the surface of a suitable permanent support by means of a suitable adhesive, if necessary, or the solution or dispersion may be coated onto a suitable support. The photopolymerizable elements may have antihalation material beneath the photopolymerizable layer. For instance, the support may contain an antihalation material or have a layer or stratum of such material on its surface. The elements may be made in the various manners described in U.S. Patents 2,760,863 and 2,791,804. The photopolymerizable layer itself can serve as the light-absorptive layer when dyes or pigments are included in the photopolymerizable composition.

Suitable base or support materials include metals, e.g., steel and aluminum plates, sheets and foils, and films or plates composed of various film-forming synthetic resins or high polymers, such as the addition polymers, including those mentioned later, and in particular vinylidene chloride copolymers with vinyl chloride, vinyl acetate, styrene, isobutylene and acrylonitrile; vinyl chloride homopolymers and copolymers with vinyl acetate, styrene, isobutylene and acrylonitrile; linear condensation polymers such as polyesters, e.g., polyethylene terephthalate; polyamides, e.g., polyhexamethylenesebacamide; and polyester amides, e.g., polyhexamethyleneadipamide adipate. Fillers or reinforcing agents can be present in the synthetic resin or polymer bases such as the various fibers (synthetic, modified, or natural), e.g., cellulosic fibers, for instance, cotton, cellulose acetate, viscose rayon, paper; glass wool; nylon and polyethylene terephthalate. These reinforced bases may be used in laminated form. The adherent support for the photopolymerizable layer can be a supporting sheet of the photopolymerizable composition. Various anchor layers as disclosed in Plambeck U.S. Patent 2,760,863 can be used to give strong adherence between the base and the photopolymerizable layer. The adhesive compositions disclosed in assignee's Burg application, Serial No. 750,868, filed July 25, 1958, are also very effective.

Printing reliefs can be made in accordance with this invention by exposing to actinic light selected portions of a photopolymerizable layer of an element described above, for example, through an image-bearing transparency or stencil having areas essentially transparent to actinic light and of substantially uniform optical density and areas opaque to actinic light and of substantially uniform optical density until substantial addition polymerization takes place, i.e., the light-exposed portions of the layer are converted to the insoluble state with no significant polymerization or cross-linking taking place in the unexposed portions or areas of the layer, and removing unexposed portions of the layer by means of a solvent for the elastomeric 1,3-butadiene polymer. During the addition-polymerization, insolubilization occurs and the elastomeric 1,3-butadiene polymer/ethylenically unsaturated compound and composition is converted to the insoluble state.

The invention will be further illustrated by but is not intended to be limited to the following examples.

*Example I*

Four hundred grams of a plastic polychloroprene made by polymerizing chloro-2-butadiene-1,3 in aqueous emulsion in the presence of dodecylmercaptan was dissolved with stirring in 1600 cc. of methyl ethyl ketone. To nine-twentieths of this solution (equivalent to 180 g. of the above-described polychloroprene) there was added with agitation 20 g. of triethylene glycol diacrylate containing 0.1% by weight anthraquinone, 0.1% by weight p-methoxyphenol and 0.1% by weight of mucochloric acid. The solution was cast by means of a doctor knife to a wet thickness of 110 mils on a 12-mil thick tin-plated steel sheet support, 12 inches by 18 inches, which had been coated with a thin layer of a lacquer composed of a mixture of a vinyl acetate/vinyl chloride copolymer and a phenolic resin. The dry thickness of the photopolymerizable layer was 15 to 17 mils. A 3-inch by 12-inch strip of the resultant element was placed in a vacuum frame, and the polymer surface was brought into contact with a line process negative. The vacuum frame containing the element and negative was placed beneath an 1800-watt, high-pressure mercury arc, and the plate exposed to 1.75 watts of actinic radiation per square inch for 100 seconds. After exposure, the negative was stripped from the element, and the unexposed polymer was removed by brush washing the element in toluene for 5 minutes. A relief image corresponding to the clear areas of the negative was obtained. The photopolymerized layer was extremely resilient, elastic and free from brittleness and the printing plate was bent through an angle of 180° without said layer cracking. The plate was placed on a printing cylinder, 4 inches in diameter, inked, and used for printing. Satisfactory printed reproductions of the original image were obtained.

*Example II*

To seven-twentieths of the solution described in Example I (equivalent to 140 g. of the polychloroprene described in that example) there was added, with stirring, 60 g. of the triethylene glycol diacrylate described in Example I. The solution was cast on the steel base support as described in Example I to give a dry thickness of 15 to 17 mils. After exposing the photopolymerizable layer through a process negative and washing out the unexposed areas as described in Example I, a printing plate was obtained with characteristics similar to those of the printing plate described in Example I. The plate was bent through an angle of 180° without the layer cracking.

*Example III*

To the remainder of the polychloroprene solution described in Example I (four-twentieths of the solution, equivalent to 80 g. of the polychloroprene described in Example I) was added with stirring 120 g. of the triethylene glycol diacrylate described in Example I. The mixture was not a solution at room temperature so 50 cc. of toluene was added to the mixture to form a two-phase system of the polychloroprene and monomeric constituents in the methyl ethyl ketone/toluene solvent solution. The two-phase system was heated on a steam bath at 50° C. for 15 minutes to form a solution and while warm the solution was cast on the steel sheet support as described in Example I. Upon exposing the photopolymerizable layer and washing out the unexposed areas as described in Example I, a printing plate was obtained with characteristics similar to those described in Example I. The plate was bent through an angle of 180°, without the photopolymerized layer cracking.

*Example IV*

Example II was repeated except that the plastic chloroprene utilized was made in aqueous emulsion in the presence of dodecylmercaptan but was designed especially for extrusion. The printing plate obtained was extremely resilient, elastic and free from brittleness as described in the previous examples. The printing plate was bent through an angle of 180° without the photopolymerized layer cracking.

*Example V*

Example II was repeated except that the plastic chloroprene utilized was made in aqueous emulsion in the presence of dodecylmercaptan and in addition contained a small proportion of 2,3-dichloro-1,3-butadiene. The washout solution used to remove the unexposed areas of the photopolymerizable layer was benzene rather than toluene. The resulting printing plate had characteristics similar to those obtained in the previous examples. The printing plate was bent through an angle of 180° without the photopolymerized layer cracking.

Practically any initiator of addition polymerization which is capable of initiating polymerization under the influence of actinic light can be used in the photopolymerizable compositions of this invention. Because transparencies transmit heat substantially equally well in the opaque and transparent areas and because the conventional light sources give off both heat and light, the preferred initiators are inactive thermally below 85° C. They should be dispersible in the composition to the extent necessary for initiating the desired polymerization under the influence of the amount of light energy absorbed in relatively short-term exposures. These initiators are useful in amounts of from 0.001% to 10.0%, or more, and preferably from 0.01% to 5.0% based on the weight of the ethylenically unsaturated compound.

Suitable photopolymerization initiators include vicinal ketaldonyl compounds, e.g., diacetyl, benzil, etc.; alpha-hetaldonyl alcohols, e.g., benzoin, pivaloin, etc.; acyloin ethers, e.g., benzoin methyl or ethyl ethers; azonitriles, e.g., 1,1'-azadicyclohexane carbonitrile; alpha-hydrocarbon-substituted aromatic acyloins including alpha-methylbenzoin, alpha-allylbenzoin, etc.; and O-alkyl xanthate esters of the type described in U.S. Patent 2,716,633.

A preferred class of addition-polymerization initiators which are thermally inactive below 185° C. is the substituted or unsubstituted polymeric quinones, having two intracyclic carbonyl groups attached to intracyclic carbon atoms in a conjugated six-membered carbocyclic ring, there being at least one aromatic carbocyclic ring fused to the ring containing the carbonyl groups. Suitable initiators of this class, in addition to the preferred anthraquinone, include 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz[a]anthracene-7,12-dione.

As previously indicated, an important aspect of the present invention comprises photopolymerizable elements suitable for the preparation of letterpress printing reliefs by the processes described in U.S. Patent 2,760,863. The thickness of the photopolymerizable layer is a direct function of the thickness desired in the relief image and this will depend on the subject being reproduced and particularly on the extent of the non-printing areas. In the case of photopolymerized halftones, the screen used also is a factor. In general, the thickness of the polymerizable layer on the base plate will vary from 3 to 250 mils. Layers ranging from 3 to 60 mils in thickness will be used for the majority of the letterpress printing plates. Layers thicker than 50 to 60 mils can be used for the printing of designs and relatively large areas in letterpress printing plates. In general, the relief height-forming stratum of the photopolymerizable layer should be essentially non-light scattering.

The photopolymerizable layers may also, if desired, include compatible plasticizers, other unsaturated compounds, and polymers. Such agents, preferably superior solvents for the elastomeric polymer, may be used to improve the rate or extent of the insolubilization throughout the photopolymerizable layer and to facilitate the removal of the unexposed areas. Useful materials are monomers containing ethylenic unsaturation, e.g., hydroxyethyl methacrylate or hydroxyethyl acrylate.

The photopolymerizable layers can also contain immiscible polymeric or non-polymeric organic or inorganic fillers or reinforcing agents which are essentially transparent, e.g., the organophilic silicas, bentonites, silica, powdered glass, etc. having a particle size less than 0.4 mil and in amounts varying with the desired properties of the photopolymerizable layer.

Even when containing plasticizers and monomeric additives as described above, the photopolymerizable compositions are, in general, solids. They are also, in general, because of their composition, somewhat tacky on the surface. This latter property is of advantage in that the compositions adhere of themselves to the base plate being used and do not usually require the application of an adhesive to retain them on the base, both during the photopolymerization and development steps and during the subsequent use of the photopolymerized material as a printing plate. A transparent parting layer such as a thin film of polystyrene or other strippable material of the known type of mold-release agents, for example, certain commercially available silicones and solutions of lecithin, may be applied on the upper surface of the photopolymerizable layer when it is desired to protect for reuse an image-bearing negative or transparency superposed thereon.

The photopolymerizable compositions of this invention can be prepared in many ways by admixing the three essential constituents specified above, i.e., (A) the compatible solvent-soluble elastomeric 1,3-butadiene compounds described above, (B) the addition-polymerizable, ethylenically unsaturated compound containing at least one terminal vinylidene group, and, uniformly dispersed therethrough, (C) an addition-polymerization initiator activatable by actinic light. For example, flowable or extrudable compositions can be made by mixing them and other desired adjuvants in any order and, if desired, with the aid of a solvent, e.g., chlorinated hydrocarbons, e.g., chloroform, carbon tetrachloride, trichlorethylene and chlorotoluene; ketones, e.g., methyl ethyl ketone, diethyl ketone and methyl isobutyl ketone; aromatic hydrocarbons, e.g., benzene, toluene and xylene. The above solvents can contain as diluents small amounts of acetone, lower molecular weight alcohols, e.g., methyl, ethyl, propyl; aliphatic hydrocarbons such as petroleum ether and solvent naphtha; and esters, e.g., methyl, ethyl and butyl acetate. The solvent can be removed later by heating the admixture or coated or extruded layer.

Conventional milling, mixing, and solution techniques can be used in making the compositions, the particular technique varying with the differences in properties of the respective components. The homogeneous, essentially non-light scattering compositions are formed into sheets in any desired manner. For example, solvent-casting, milling or extrusion are suitable methods for preparing layers of the desired thickness.

Actinic light from any source and of any type can be used in these photopolymerization processes. The light may emanate from point sources or be in the form of parallel rays or divergent beams. By using a broad light source, relatively close to the image-bearing transparency, the light rays passing through the clear areas of the transparency enter as divergent beams and thus irradiate a continually diverging area in the photopolymerizable layer underneath the clear portions of the transparency, resulting in a polymeric relief having its greatest width at the bottom of the photopolymerized layer, i.e., a frustum, the top surface of the relief being the dimensions of the clear area. Inasmuch as the free-radical-generating addition-polymerization initiators activatable by actinic light generally exhibit their maximum sensitivity in the ultraviolet range, the light source should furnish an effective amount of this radiation. Such sources include carbon arcs, mercury-vapor lamps, fluorescent lamps with special ultraviolet-light-emitting phosphors, argon glow lamps, and photographic flood lamps. Of these, the mercury-vapor lamps, particularly the sun-lamp type, and the fluorescent sun lamps, are most suitable.

When highly reflective bases are used, oblique rays passing through clear areas in the image-bearing transparency will strike the surface of the base at an angle other than 90° and after reflection will cause polymerziation in the non-image areas. This disadvantage can be overcome when the photopolymerizable layer is on a light-reflective base by an intervening stratum sufficiently absorptive of actinic light so that less than 35% of the incident light is reflected. The layer absorptive of reflected light or non-light scattering layer, or antihalation layer, can be made by dispersing a finely-divided dye or pigment which substantially absorbs actinic light in a solution or aqueous dispersion of a resin or polymer which is adherent to both the support and the photopolymerized image and coating it on the support to form an anchor layer which is dried. Suitable antihalation pigments include carbon black, manganese dioxide, dyes, e.g., Acid Blue Black (CI 20470) and Acid Magenta O (CI 42685). A dyed metal plate is also useful.

The antihalation layer intermediate between the photopolymerizable layer and the reinforcing metal base plate must have adequate adhesion to the reinforcing base plate and the photopolymerizable layer and not react with the light-absorptive material. Suitable polymeric or resin carriers for the light-absorptive dyes or pigments which can be used include polyvinyl compounds, e.g., polyvinyl chloride homopolymers, and copolymers, e.g., vinyl chloride with vinyl acetate, diethyl fumarate or ethyl acrylate. Acrylic and methacrylic acid may also be used.

The photopolymerizable compositions may also contain a small amount of a thermal addition polymerization inhibitor, e.g., 0.001% to 2.0% based on the weight of the ethylenically unsaturated compound. Suitable inhibitors that can be used in addition to the preferred p-methoxyphenol include hydroquinone, and alkyl- and aryl-substituted hydroquinones, tert-butylcatechol, pyrogallol, copper resinate, naphthylamines, beta-naphthol, cuprous chloride, 2,6-di-tert-butyl-p-cresol, 2,6 - di - tert - butyl - 4-methylphenol, phenothiazine, pyridine, nitrobenzene and dinitrobenzene. Other useful inhibitors include p-toluquinone, chloranil and thiazine dyes, e.g., Thionine Blue G (CI 52025), Methylene Blue B (CI 52015) and Toluidine Blue O (CI 52040). Such compositions can be photopolymerized without removal of the inhibitor.

The solvent liquid used for washing or "developing" the plates made from the photopolymerizable compositions of this invention should have good solvent action on the solvent-soluble elastomeric 1,3-butadiene polymer/ethylenic composition and little action on the insolubilized image or upon the base material, antihalation layer, or anchor layer in the period required to remove the nonpolymerized portions. Methyl ethyl ketone, benzene, toluene, xylene, carbon tetrachloride, etc. are particularly useful solvents. Best results are obtained when the solvent is warm, e.g., 30–50° C.

In the development step where the relief is formed the solvent may be applied in any convenient manner, as by pouring, immersion, or spray. Brushing aids in the removal of the unpolymerized portion of the composition.

Photopolymerizable elements suitable for making relief images can, as has been shown above, have on the photopolymerizable surface a protective removable or strippable layer and, if desired, also can have on the reverse surface of the support a pressure-sensitive adhesive layer provided with a protective strippable layer. Upon removal of the latter, the element can be pressed onto or otherwise adhered to a permanent support, e.g., a printing block or metal plate.

The printing reliefs made in accordance with this invention can be used in all classes of printing but are most applicable to those classes of printing wherein a distinct difference of height between printing and non-printing areas is required. These classes include those wherein the ink is carried by the raised portion of the relief such as in dry-offset printing, ordinary letterpress printing, the latter requiring greater height differences between printing and non-printing areas, and those wherein the ink is carried by the recessed portions of the relief such as in intaglio printing, e.g., line and inverted halftone. The plates are also useful for multicolor printing. In addition, printing plates are useful for "rubber plate" printing whereby the plate is placed on a cylinder and is brought into contact with a printing surface, e.g., paper on a second cylinder made of steel or other metal. The printing occurs in the nip areas of the cylinders.

The photopolymerizable compositions of this invention are also useful in the preparation of photo-resists for etching, gravure, etc.; planographic plates; and screens for "silk screen" printing or as stencils. The compositions can be coated onto printing cylinders, e.g., plastic or metal cylinders.

The photopolymerizable compositions are suitable for other purposes, in addition to the printing uses described above, in which readily insolubilized, solid, addition polymerizable compositions are useful, e.g., as ornamental plaques or for producing ornamental effects; as patterns for automatic engraving machines, foundry molds, cutting and stamping dyes, name stamps, relief maps; for braille; as rapid cure coatings, e.g., on film base, inside tanks; as variable area and variable density sound tracks on film; for embossing plastics, paper, etc., e.g., with a die prepared from said photopolymerizable compositions; in the preparation of printed circuits; for affixing phosphors to surfaces to provide color television screens; and in the preparation of other plastic articles.

This invention provides photopolymerizable elements for producing letterpress printing plates of uniform printing height from relatively inexpensive materials and with a marked reduction in labor requirements over the conventional photoengraving procedure. The images obtained show fidelity to the original transparency both in small details and in overall dimensions. The printing reliefs have the advantage that they have high impact strength and are not brittle but are tough and abrasion-resistant and have unusually long press wear. The reliefs are durable and dependable and have a resilient surface but do not become permanently deformed in normal use.

What is claimed is:

1. A photopolymerizable composition comprising (1) at least 40% by weight of at least one solvent-soluble, elastomeric homopolymer of poly(chloro-2-butadiene-1,3), (2) at least 10% by weight of a compatible non-gaseous addition polymerizable ethylenically unsaturated compound containing 1 to 2 terminal ethylenic groups, there being at least one such ethylenic group for each 300 units of molecular weight, said unsaturated compound having a boiling point above 100° C. at atmospheric pressure, a molecular weight from about 100 to 1500 and being capable of forming high molecular weight addition polymers readily by photoinitiated addition polymerization in the presence of an addition polymerization initiator, and (3) 0.001 to 10% by weight of the unsaturated compound of such an initiator which is activatable by actinic light and inactive thermally below 85° C.

2. A composition as set forth in claim 1 wherein said initiator is inactive thermally at temperatures below 185° C.

3. A composition as defined in claim 1 wherein said polymerizable compound is a polyethylene glycol diacrylate.

4. A composition as defined in claim 1 wherein said polymerizable compound is triethylene glycol diacrylate.

5. A photopolymerizable element comprising a support bearing on its surface a solid layer of a photopolymerizable composition comprising (1) at least 40% by weight of a solvent-soluble, elastomeric homopolymer of a poly(chloro-2-butadiene-1,3), (2) at least 10% by weight of a compatible non-gaseous addition polymerizable ethylenically unsaturated compound containing 1 to 2 terminal ethylenic groups, there being at least one such ethylenic group for each 300 units of molecular weight, said unsaturated compound having a boiling point above 100° C. at atmospheric pressure, a molecular weight from about 100 to 1500 and being capable of forming high molecular weight addition polymers readily by photoinitiated addition polymerization in the presence of an addition polymerization initiator, and (3) 0.001 to 10% by weight of the unsaturated compound of such an initiator which is activatable by actinic light and inactive thermally below 85° C.

6. An element as set forth in claim 5 wherein said initiator is inactive thermally at temperatures below 185° C.

7. An element as set forth in claim 5 wherein said polymerizable compound is a polyethylene glycol diacrylate.

8. An element as set forth in claim 5 wherein said polymerizable compound is triethylene glycol diacrylate.

References Cited in the file of this patent

UNITED STATES PATENTS

| | | |
|---|---|---|
| 2,722,512 | Crandall | Nov. 1, 1955 |
| 2,760,863 | Plambeck | Aug. 28, 1956 |